US008618002B2

(12) United States Patent
Kang et al.

(10) Patent No.: US 8,618,002 B2
(45) Date of Patent: Dec. 31, 2013

(54) RESIST PATTERN FORMATING METHOD

(75) Inventors: Wenbing Kang, Kakegawa (JP); Xiaowei Wang, Kakegawa (JP); Yuriko Matsuura, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 51 days.

(21) Appl. No.: 13/131,739

(22) PCT Filed: Nov. 30, 2009

(86) PCT No.: PCT/JP2009/070102
§ 371 (c)(1),
(2), (4) Date: May 27, 2011

(87) PCT Pub. No.: WO2010/064600
PCT Pub. Date: Jun. 10, 2010

(65) Prior Publication Data
US 2011/0241173 A1   Oct. 6, 2011

(30) Foreign Application Priority Data

Dec. 1, 2008 (JP) ................................ 2008-306435

(51) Int. Cl.
*H01L 21/027* (2006.01)
(52) U.S. Cl.
USPC .................... 438/763; 257/E21.026; 430/313
(58) Field of Classification Search
USPC ........... 257/E21.024, E21.026; 430/312, 313; 438/763, 948
See application file for complete search history.

(56) References Cited

U.S. PATENT DOCUMENTS

| 4,837,124 | A * | 6/1989 | Wu et al. ................... 430/270.1 |
| 5,260,172 | A * | 11/1993 | Ito .............................. 430/323 |
| 5,429,910 | A | 7/1995 | Hanawa |
| 6,171,761 | B1 * | 1/2001 | Minamide et al. ............ 430/313 |
| 8,097,401 | B2 * | 1/2012 | Huang et al. ................... 430/323 |
| 2004/0053170 | A1 * | 3/2004 | Ijima et al. ..................... 430/311 |
| 2006/0124586 | A1 | 6/2006 | Kobayashi et al. |
| 2006/0238727 | A1 * | 10/2006 | Tsai et al. ........................ 355/50 |
| 2007/0010409 | A1 | 1/2007 | Zhang et al. |
| 2007/0010412 | A1 | 1/2007 | Zhang et al. |
| 2007/0105043 | A1 * | 5/2007 | Elian et al. .................. 430/270.1 |
| 2008/0193880 | A1 * | 8/2008 | Nishibe et al. .............. 430/286.1 |
| 2009/0226843 | A1 * | 9/2009 | Hatakeyama et al. ..... 430/286.1 |
| 2009/0317752 | A1 | 12/2009 | Kobayashi et al. |
| 2010/0304313 | A1 | 12/2010 | Zhang et al. |

FOREIGN PATENT DOCUMENTS

| JP | 5-299336 | A | 11/1993 |
| JP | 6-186754 | A | 7/1994 |
| JP | 6-222570 | A | 8/1994 |
| JP | 7-140674 | A | 2/1995 |
| JP | 7-142349 | A | 6/1995 |
| JP | 8-8163 | A | 1/1996 |
| JP | 2000-267298 | A | 9/2000 |
| JP | 2002-131931 | A | 5/2002 |
| JP | 2004-78217 | A | 3/2004 |
| JP | 2004-184648 | A | 7/2004 |
| JP | 2007-173274 | A | 7/2007 |
| JP | 2008-145674 | A | 6/2008 |
| JP | 2008-152103 | A | 7/2008 |
| JP | 2008-241931 | A | 10/2008 |

OTHER PUBLICATIONS

English Language Abstract of JP 6-105683 B from Espacenet.
Machine Language English Translation of JP 5-299336 A from JPO.
Machine Language English Translation of JP 6-222570 A from JPO.
Machine Language English Translation of JP 7-140674 A from JPO.
Machine Language English Translation of JP 7-142349 A from JPO.
Machine Language English Translation of JP 8-8163 A from JPO.
Machine Language English Translation of JP 2000-267298 A from JPO.
Machine Language English Translation of JP 2002-131931 A from JPO.
Machine Language English Translation of JP 2007-173274 A from JPO.
Machine Language English Translation of JP 2008-145674 A from JPO.
Machine Language English Translation of JP 2008-152103 A from JPO.
Machine Language English Translation of JP 2008-241931 A from JPO.

* cited by examiner

*Primary Examiner* — Allan R Wilson
(74) *Attorney, Agent, or Firm* — Sangya Jain

(57) ABSTRACT

The present invention provides a pattern formation method capable of preventing formation of surface defects. In the method, a resist surface after subjected to exposure is coated with an acidic film and then subjected to heating treatment. This method is suitably adopted in a process employing liquid immersion lithography and/or light of short wavelength, such as ArF excimer laser beams, for producing a very fine pattern.

14 Claims, No Drawings

RESIST PATTERN FORMATING METHOD

This application is a United States National Stage Patent Application under 35 U.S.C. §371 of International Patent Application No. PCT/JP2009/070102 filed Nov. 30, 2009, which claims priority to Japanese Patent Application No. 2008-306435, filed Dec. 1, 2008, the contents of both documents being hereby incorporated herein by reference.

TECHNICAL FIELD

This invention relates to a resist pattern formation method employed in processes for production of semiconductor devices and the like.

BACKGROUND ART

Nowadays, photo-lithography is generally adopted in processes for production of semiconductor circuits. In a photo-lithographic process, a resist film is imagewise exposed to light so as to generate acid by a photochemical reaction. The generated acid acts on the resist, for example, it induces an elimination reaction of protecting groups of the resist, so that the solubility of the resist is changed to form a pattern.

Actually, however, depending upon the environmental conditions under which the resist is placed, the concentration of acid in the exposed area patterned by the exposure may so vary that the elimination reaction of protecting groups insufficiently proceeds in a practical photo-lithographic process. As a result, the formed pattern often suffers from surface defects such as resist residues, blob defects and blocking defects of holes. Those defects can be sometimes reduced if the resist surface is coated with a water-soluble acidic surface antireflection film.

Meanwhile, in accordance with recent demand for miniaturizing semiconductor circuits, the sizes of resist patterns have been also required to be miniaturized. In order to meet the requirement, it has been studied for lithographic processes to employ light of shorter wavelength, such as, KrF or ArF excimer laser beams. Further, "liquid immersion lithography" is becoming practically used to advance the miniaturization. The liquid immersion lithography is a technique in which liquid medium is inserted between the wafer and a projection lens in the exposure step so that refraction in the liquid medium is utilized to form a high-resolution pattern. As the liquid medium, pure water is often used in recent liquid immersion lithographic processes that are becoming adopted in practical production.

Since the resist is brought into direct contact with the liquid medium such as pure water in a liquid immersion lithographic process, components contained in the resist are liable to dissolve out into the liquid medium. Accordingly, the concentration of acid formed in the exposed resist is more likely to decrease than in a normal lithographic process. However, the aforementioned water-soluble acidic surface antireflection film, which can be provided on the resist surface in a normal lithographic process, cannot be used in the liquid immersion lithographic process because the resist surface is brought into contact with water. In that case, therefore, some measures are taken to prevent the components in the resist from dissolving out. For example, the resist surface is covered with a film insoluble in the liquid medium and/or the resist is made to contain additives that prevent the components from dissolving out.

In a liquid immersion lithographic process employing pure water as the liquid medium, the contact angle of pure water to the resist surface is generally designed to be so large that water drops may not remain on the resist surface. That is for the purpose of speeding up the exposure step. On the other hand, however, if the contact angle is enlarged, it is difficult in the development step to soak the resist with a developing solution containing water as the solvent. As a result, defects are liable to form in the resist. Thus, there is a dilemma in that, although the contact angle is preferably enlarged from the viewpoint of speeding up the procedure, the enlarged contact angle may promote formation of blob defects and blocking defects in hole patterns.

In order to solve the above problems, some processes have been proposed. In each process, the resist is rinsed with a rinse solution after subjected to exposure, heat baking and development with a developing solution. For example, the resist may be rinsed with a rinse solution of low surface tension (Patent document 1). The rinse solution may be warm water or an organic solvent compatible with a surfactant or pure water (Patent document 2), and the surfactant may be a fluorine-containing surfactant (Patent document 3). The rinse solution may contain solvents such as alcohols (Patent documents 4 and 5). Further, the resist may be rinsed with a rinse solution of low viscosity such as hot water (Patent document 6). It is also proposed to add a surfactant having a particular structure into the rinse solution (Patent documents 7 and 8). Those processes are so designed that defects are allowed to form but are removed after development of the resist. After the resist is subjected to exposure and heat baking, a surface modifier may be used to reduce the contact angle of the developing solution to the resist surface (Patent document 9). However, those proposed processes are still so designed as to remove the defects in the developed resist afterward but as not to solve the essential problem of acid concentration decrease in the exposed area patterned by the exposure.

PRIOR ART DOCUMENTS

Patent Documents

[Patent document 1] Japanese Patent Publication No. H6(1994)-105683
[Patent document 2] Japanese Patent Laid-Open No. H8(1996)-8163
[Patent document 3] Japanese Patent Laid-Open No. H7(1995)-142349
[Patent document 4] Japanese Patent Laid-Open No. H7(1996)-140674
[Patent document 5] Japanese Patent Laid-Open No. 2008-152103
[Patent document 6] Japanese Patent Laid-Open No. H6(1994)-222570
[Patent document 7] Japanese Patent Laid-Open No. 2004-7217
[Patent document 8] Japanese Patent Laid-Open No. 2004-184648
[Patent document 9] Japanese Patent Laid-Open No. 2008-145674

DISCLOSURE OF INVENTION

Problem to be Solved by the Invention

It is an object of the present invention to provide a pattern formation method capable of preventing defects, such as, blob defects and blocking defects in hole patterns, from forming in lithographic processes for production of resist patterns.

Means for Solving Problem

The present invention provides a pattern formation method, comprising the steps of:

applying a resist composition onto a substrate, to form a resist film;

subjecting said resist film to exposure;

coating said resist film with an acidic film-forming composition containing a polymer and a solvent that does not dissolve said resist film, so that said resist film is covered with an acidic film;

heating said resist film; and then developing said resist film with a developing solution.

The present invention also provides a semiconductor device comprising a pattern formed by the above method.

Effect of the Invention

The present invention enables to improve blocking of contact holes and to reduce defects often occurring in the development step, and accordingly can make it possible to produce a resist pattern less suffering from defects. Further, since providing a resist pattern formation process having those advantages, the present invention can reduce defective products of semiconductor devices and hence can improve the production yield.

BEST MODE FOR CARRYING OUT THE INVENTION

A conventional normal photo-lithographic pattern formation method generally comprises the steps of:

applying a resist composition onto a substrate, to form a resist film;

subjecting said resist film to exposure;

heating said resist film; and then developing said resist film with a developing solution. In contrast with the conventional method, the present invention comprises a step of forming an acidic film between after the exposure step and before the step of heating the resist. It should be noted that this simple step can reduce defects of the resultant pattern.

Except for the step of forming an acidic film, the pattern formation method of the present invention can be carried out in the same manner as the conventional method. The method according to the present invention will be described below in detail.

First, a resist composition is applied on a surface, which may be pretreated, if necessary, of a substrate, such as a silicon substrate or a glass substrate, according to a known coating method such as spin-coating method, to form a resist composition layer. Prior to the coating of the resist composition, an undercoating antireflection film can be beforehand formed by coating under the resist composition layer. The antireflection film can improve the section shape and the exposure margin.

Any known resist composition can be used in the pattern formation method of the present invention. Representative examples of the compositions usable in the present invention include: a composition comprising a quinine-diazide type photosensitive substance and an alkali-soluble resin (which is a positive-working composition); a composition comprising a photosensitive functional group-containing polymer such as polyvinyl cinnamate, a composition comprising an aromatic azide compound, a composition comprising a cyclized rubber and an azide compound such as a bisazide compound, a composition comprising a diazo resin, and a photo-polymerizable composition comprising an addition-polymerizable unsaturated compound (which are negative-working compositions). Further, chemically amplified resist compositions can be also preferably used.

Examples of the quinonediazide type photosensitive substance used in the positive-working resist composition comprising a quinonediazide type photosensitive substance and an alkali-soluble resin include: 1,2-benzoquinonediazide-4-sufonic acid, 1,2-naphtho-quinonediazide-4-sufonic acid, 1,2-naphthoquinone-diazide-5-sufonic acid, and sufonic esters or amides thereof. Examples of the alkali-soluble resin include: novolak resin, polyvinyl phenol, polyvinyl alcohol, and copolymers of acrylic acid or methacrylic acid. The novolak resin is preferably prepared from one or more phenols such as phenol, o-cresol, m-cresol, p-cresol and xylenol in combination with one or more aldehydes such as formaldehyde and paraformaldehyde.

Either positive- or negative-working chemically amplified resist composition can be used in the pattern formation method of the present invention. The chemically amplified resist generates an acid when exposed to radiation, and the acid serves as a catalyst to promote chemical reaction by which solubility to the developing solution is changed within the areas irradiated with the radiation to form a pattern. For example, the chemically amplified resist composition comprises an acid-generating compound, which generates an acid when exposed to radiation, and an acid-sensitive functional group-containing resin, which decomposes in the presence of acid to form an alkali-soluble group such as phenolic hydroxyl or carboxyl group. The composition may comprise an alkali-soluble resin, a crosslinking agent and an acid-generating compound. It is assumed that, according to the present invention, a reduction of the defects is achieved by compensating for the acid concentration variation, which is caused by environmental conditions, in the resist film. Accordingly, it is particularly preferred to use the chemically amplified resist composition in the pattern formation method of the present invention.

The thickness of the resist pattern is properly determined according to the use and the like, but is generally 0.05 to 2.5 µm, preferably 0.1 to 1.5 µm.

The resist composition layer formed on the substrate is prebaked, for example, on a hot plate to remove at least a part of solvent contained in the composition, to form a resist film. The prebaking temperature depends on the solvent and the resist compound, but is normally approx. 20 to 200° C., preferably approx. 50 to 150° C.

The resist film is then subjected to exposure through a mask, if necessary, by use of light in the wavelength range of not longer than 250 nm. For example, the resist film is exposed to KrF excimer laser beams or ArF excimer laser beams, preferably, ArF excimer laser beams. In a process for producing a more miniaturized pattern, light of shorter wavelength is generally used but it is also preferred to employ electron beams or extreme UV light. However, there are many technical and cost problems in using light of shorter wavelength. In view of that, it is preferred to adopt a liquid immersion exposure process, which enables to produce a more miniaturized pattern even by use of light of the same wavelength. In the liquid immersion exposure process, the resist is brought into contact with liquid medium and hence the acid concentration in the resist is liable to decrease. Accordingly, it is particularly preferred to adopt the present invention in combination with the liquid immersion exposure process. The liquid immersion exposure process employing the present invention enables to produce a pattern that has a pattern width of approx. 30 nm without suffering from defects.

The liquid immersion exposure is a technique in which liquid medium is inserted between the wafer and a projection lens and then exposure is carried out. As the liquid medium, pure water is generally used in many cases but other higher refractive liquid can be used. When the present invention is applied to a liquid immersion exposure process, there is no particular restriction and hence the process can be carried out in the normal manner.

After the exposure, the surface of the resist film is coated with an acidic film-forming composition, and thereby the resist film surface is covered with an acidic film having a pH value of less than 7.

The acidic film-forming composition contains a solvent that does not dissolve the resist film so as not to change the shape of the exposed resist film. Accordingly, the solvent is selected according to the kind of the resist film. Since the resist film is generally made of resin, water is one of the most preferred solvents usable in the acidic film-forming composition. As the solvent, lower alcohols such as methanol, ethanol and propanol are also employable. Further, two or more solvents can be used in combination.

In the present invention, the acidic film-forming composition is used for the purpose of forming an acidic film on the surface of the resist film. The acidic film-forming composition in itself, therefore, must be acidic. The composition has a pH value of preferably 0.6 to 6.5, more preferably 1.4 to 2.7. In order to make the composition acidic, acidic substance is incorporated. There is no particular restriction on the acidic substance, and either organic or inorganic acids can be used. Examples of the organic acids include alkylcarboxylic acids, alkylsulfonic acids, fluorinated alkylsulfonic acids, and alkylbenzenesulfonic acids. They may have either straight-chain or branched-chain structures, may have aromatic substituent groups, and may have plural acidic groups. Examples of the inorganic acids include sulfuric acid and hydrofluoric acid. Those acids are properly selected according to the kind of the resist composition and the use of the resultant pattern, but organic acids are generally preferred.

The acidic film-forming composition also contains a polymer, from which a film is formed on the resist film surface. Examples of the polymer include vinylpyrrolidone-containing copolymers such as polyvinylpyrrolidone, vinyl alcohol, vinylimidazole, 2-hydroxyethyl methacrylate, ethyleneoxide unit-containing vinyl monomer.

It is unnecessary for the acidic film-forming composition to contain both of the acidic substance and the polymer independently. Instead of containing them independently, the composition may contain an acidic polymer. For example, acidic copolymers, such as, polyacrylic acid, polymethacrylic acid, polymaleic acid and polystyrene sulfonic acid, can be used as a combination of the acidic substance and the polymer. The acidic film-forming composition may contain those polymers and the acidic substance in combination.

The acidic film-forming composition may further contain a surfactant so as to improve film-formability on the resist film. There is no particular restriction on the surfactant, but nonionic surfactants, such as, acetyleneglycol type surfactants and polyethyleneoxide, are particularly preferred, if used.

There is no particular restriction on the solid content of the acidic film-forming composition, as long as the composition can form an acidic film on the resist film. However, the composition preferably has such a solid content as to form an acidic film of 5 to 500 nm thickness, more preferably 20 to 100 nm thickness, on the resist film.

There is also no particular restriction on the method for coating the acidic film-forming composition. It can be freely selected from the methods usable for coating the resist composition. In view of easiness, spin-coating method is preferably adopted.

After coated with the acidic film-forming composition to form an acidic film, the resist is subjected to heating. This step of heating corresponds to post exposure baking (hereinafter, often referred to as "PEB") in a normal pattern formation method. In the present invention, the heating step is carried out not immediately after the exposure but immediately after the formation of the acidic film. Nevertheless, however, that is also referred to as "PEB" in the present invention for the sake of convenience.

The step of PEB is generally for the purpose of promoting chemical amplification effects, such as, an elimination reaction of protecting groups from the resist film. In the present invention, since the resist film is covered with an acidic film, unevenness of acid concentration in the exposed area of the resist film is so compensated by the acidic film that the protecting groups can evenly undergo the elimination reaction in the PEB step. The present invention is thus presumed to prevent formation of defects. In addition, the acidic film also improves affinity with the developing solution in the unexposed area of the resist film because the unexposed area is also brought into contact with acid released from the acidic film. Consequently, this also contributes toward preventing formation of defects. The acidic film thus acts on both of the exposed and unexposed areas. Accordingly, if the resist film is made of positive-working resist, the whole film becomes thinner but the loss of the thickness is not more than a few nanometers. The thickness loss, hence, gives negligible effects, as compared with the effect of preventing formation of defects. Further, pH value of the acidic film can be controlled in order to form a better pattern. As described above, the present invention is characterized by preventing formation of defects, and is therefore very different from the methods described in Patent documents 1 to 9, in which defects are allowed to form but are removed afterward.

After the step of PEB, development such as paddle development is carried out to form a resist pattern. The resist film is normally developed with an alkaline developing solution.

Examples of the alkaline developing solution usable in the present invention include an aqueous solution of sodium hydroxide or tetramethylammonium hydroxide (TMAH). After the development, the resist pattern is rinsed (washed) with a rinse solution according to necessity, preferably, pure water. The thus formed resist pattern is employed as a resist for etching, plating, ion diffusion or dyeing, and then, if necessary, peeled away.

The pattern thus formed by the method of the present invention is then fabricated according to the use. The method of the present invention does not particularly restrict the fabrication, and hence the resist pattern can be fabricated in a conventional manner.

The pattern obtained according to the method of the present invention can be employed for manufacture of semiconductor devices, flat panel displays (FPDs) such as liquid crystal displays, charge-coupled devices (CCDs), color filters and the like, in the same manner as patterns formed by the conventional methods are employed for.

The present invention is further explained by use of the following Examples, but they by no means restrict embodiments of the present invention.

Preparation Example

Preparation of Acidic Film-Forming Compositions

Powdery polyvinylpyrrolidone (hereinafter, referred to as "PVP") having a weight average molecular weight of 3000 was dissolved in pure water in a solid content of 6%. Into the solution, a straight-chain alkylsulfonic acid having about 12 carbon atoms was added in a weight concentration of 0.06%. The obtained solution was filtrated through a UPE filter (manufactured by Entegris Inc.) having a pore size of 0.05 µm, to prepare Sample 1 (pH=2.9).

Independently, the same PVP was dissolved in pure water in a solid content of 0.6 wt %. Into the solution, a straight-chain alkylsulfonic acid having about 12 carbon atoms was added in an amount of 1 wt % based on the weight of PVP. Further, perfluorobutanesulfonic acid was added into the solution in an amount of 50 wt % based on the weight of PVP. The obtained solution was divided into six portions, and monoethanol amine was added into the portions in such different amounts that the pH values might be 1.2, 1.9, 2.1, 3.0, 3.3 and 4.0. The portions were then filtrated through the UPE filter, to prepare Samples 2, 3, 4, 5, 6 and 7.

In the same manner, fluorinated polyethylene type copolymer having carboxylic acid groups at the side chain was dissolved to prepare an aqueous solution thereof. The solution was divided into three portions, and monoethanol amine was added into the portions in such different amounts that the pH values might be 1.4, 1.7 and 2.2. The portions were then filtrated through the UPE filter, to prepare Samples 8, 9 and 10.

The procedure was repeated except for using an aqueous solution of polyacrylic acid, to prepare Sample 11 (pH=1.9). The procedure was again repeated except for using an aqueous solution of polymaleic acid, to prepare Sample 12 (pH=1.5). Further, octylsulfonic acid and surfactant SUR-FYNOL 2502 ([trademark], manufactured by Air Products and Chemicals, Inc.) were added into an aqueous solution of polyvinyl alcohol in an amount of 300 ppm, to prepare Sample 13 (pH=2.4).

Examples 1 to 13 and Comparative Example 1

Evaluation of Effect on KrF Resist

A silicon substrate was coated with a KrF resist (DX5250P [trademark], manufactured by AZ Electronic Materials (Japan) K.K.) to form film having a thickness of 510 nm, and then baked at 90° C. for 60 seconds. The formed resist film was then subjected to exposure by means of a KrF exposure apparatus (FPA-EX5 [trademark], manufactured by Canon Inc.) under such exposure conditions that a contact hole pattern of 200 nm having pitch of 1:1 could be obtained. The procedure was repeated to prepare plural resist films already subjected to exposure.

Each exposed resist film thus prepared was individually spin-coated with each of Samples 1 to 13 at 1500 rpm, and then subjected to PEB at 110° C. for 70 seconds. Immediately after that, the films were developed with a 2.38% aqueous solution of tetramethylammonium hydroxide (hereinafter, referred to as "2.38% TMAH") to produce patterns.

On the other hand, as Comparative Example 1, one of the exposed resist films was not coated with an acidic film and directly subjected to PEB, and then developed with 2.38% TMAH to produce a pattern.

The contact hole patterns thus obtained were observed by means of CD-SEMS-9200 ([trademark], manufactured by Hitachi Ltd.).

As a result, the pattern of Comparative Example 1, in which the pattern was not coated with an acidic film, was observed to have many insufficiently opened (namely, blocked) contact holes. In contrast, Examples 1 to 13, in which the patterns were subjected to PEB after coated with acidic films, exhibited remarkable improvement. There were hardly any insufficiently opened contact holes in the patterns of Examples 1 to 4 and 8 to 13. Although the patterns of Examples 5 to 7 had a few insufficiently opened contact holes, they had no problems to use practically. Further, the section shape of each pattern was observed under a scanning electron microscope S-4700 ([trademark], manufactured by Hitachi, Ltd.), and thereby it was found that the pattern of Comparative Example 1 had too many completely blocked holes to use practically. On the other hand, it was also found that the patterns of Examples tended to lose thickness if the applied acidic film-forming compositions had low pH values. If the compositions had high PH values, the patterns tended to become slightly in the T-top shape. However, there were no practical problems in those tendencies. It should be noted that the patterns were in very favorable shapes if the acidic films had pH values of 1.4 to 2.7. The results were as set forth in Table 1.

TABLE 1

| Sample | pH | Number of blocked holes | Pattern shape |
| --- | --- | --- | --- |
| Ex. 1 | 1 | 2.9 | almost zero | slightly in T-top shape, but favorable |
| Ex. 2 | 2 | 1.2 | almost zero | large thickness loss, but favorable |
| Ex. 3 | 3 | 1.9 | almost zero | favorable |
| Ex. 4 | 4 | 2.1 | almost zero | favorable |
| Ex. 5 | 5 | 3.0 | a few | slightly in T-top shape, but favorable |
| Ex. 6 | 6 | 3.3 | a few | slightly in T-top shape, but favorable |
| Ex. 7 | 7 | 4.0 | a few | slightly in T-top shape, but favorable |
| Ex. 8 | 8 | 1.4 | almost zero | favorable |
| Ex. 9 | 9 | 1.7 | almost zero | favorable |
| Ex. 10 | 10 | 2.2 | almost zero | favorable |
| Ex. 11 | 11 | 1.9 | almost zero | favorable |
| Ex. 12 | 12 | 1.5 | almost zero | favorable |
| Ex. 13 | 13 | 2.4 | almost zero | favorable |
| Com . 1 | without an acidic film | | many | many completely blocked holes |

Examples 14 to 18 and Comparative Example 2

Evaluation of Effect on ArF Resist in Liquid Immersion Exposure

A silicon substrate was coated with an ArF resist (AX2050P [trademark], manufactured by AZ Electronic Materials (Japan) K.K.) to form film having a thickness of 120 nm, and then baked at 100° C. for 60 seconds. The formed resist film was then subjected to liquid immersion exposure by means of an ArF exposure apparatus (manufactured by Nikon Corporation) under such exposure conditions that a contact hole pattern of 130 nm having pitch of 1:1 could be obtained. The procedure was repeated to prepare plural resist films already subjected to exposure.

Each exposed resist film thus prepared was individually coated with each of Samples 3, 4, 8, 10 and 11, and then subjected to PEB at 110° C. for 60 seconds. Immediately after that, the films were developed with 2.38% TMAH to produce patterns.

On the other hand, as Comparative Example 2, one of the exposed resist films was not coated with an acidic film and directly subjected to PEB, and then developed with 2.38% TMAH to produce a pattern.

The results were as set forth in Table 2. The pattern of Comparative Example 2, in which the pattern was not coated with an acidic film, was observed to have many insufficiently opened holes and many completely blocked holes. On the other hand, there were hardly any insufficiently opened contact holes in all the patterns of Examples, in which the patterns were coated with acidic films. Further, all the patterns of Examples were also observed to have favorable section shapes.

TABLE 2

| Sample | pH | Number of blocked holes | Pattern shape |
|---|---|---|---|
| Ex. 14 | 3 | 1.9 | almost zero | favorable |
| Ex. 15 | 4 | 2.1 | almost zero | favorable |
| Ex. 16 | 8 | 1.4 | almost zero | favorable |
| Ex. 17 | 10 | 2.2 | almost zero | favorable |
| Ex. 18 | 11 | 1.9 | almost zero | favorable |
| Com. 2 | without an acidic film | | many | many completely blocked holes |

Example 19 and Comparative Example 3

Evaluation of Blob Defects on ArF Resist in Liquid Immersion Exposure

A silicon substrate was coated with an ArF resist (manufactured by AZ Electronic Materials (Japan) K.K.) to form film having a thickness of 100 nm, and then baked at 100° C. for 60 seconds. The formed resist film was then subjected to exposure by means of an ArF liquid immersion exposure apparatus under such exposure conditions that lines of 70 nm width having pitch of 1:1 could be obtained. The surface of the exposed resist was coated with Sample 3, and then subjected to PEB at 110° C. for 60 seconds. Immediately after that, the resist was developed with 2.38% TMAH.

On the other hand, as Comparative Example 3, the exposed resist was not coated with an acidic film and directly subjected to PEB, and then developed with 2.38% TMAH to produce a pattern.

The surfaces of the resultant substrates were observed by means of CD-SEMS-9200 ([trademark], manufactured by Hitachi Ltd.). As a result, it was found that the surface of Example 19 had much less blob defects than that of Comparative Example 3.

The invention claimed is:

1. A pattern formation method, comprising the steps of:
applying a resist composition onto a substrate, to form a resist film;
subjecting said resist film to exposure;
coating said resist film with an acidic film-forming composition containing a polymer and a solvent that does not dissolve said resist film, so that said resist film after exposure is covered with an acidic film;
heating said resist film; and then
developing said resist film with a developing solution; wherein the polymer is selected from a group consisting of polymethacryllic acid, polymaleic acid and polystyrenesulfonic acid, and wherein the exposure for pattern formation is carried out by the use of electron beams or extreme ultraviolet light.

2. The pattern formation method according to claim 1, wherein said exposure is carried out in the manner of liquid immersion exposure.

3. The pattern formation method according to claim 1, wherein said acidic film-forming composition has a pH value of 0.5 to 6.5.

4. A semiconductor device comprising a pattern formed by the method according to claim 1.

5. The pattern formation method according to claim 1, wherein said acidic film-forming composition has a pH value of 1.4 to 2.7.

6. The pattern formation method according to claim 1, wherein said exposure is carried out with 193 nm radiation.

7. The pattern formation method according to claim 1, wherein said exposure is carried out with 193 nm immersion exposure process.

8. The pattern formation method according to claim 1, wherein the acidic film-forming composition further comprises an acidic compound.

9. The pattern formation method according to claim 1, wherein the polymer is acidic.

10. The pattern formation method according to claim 1, wherein the acidic film-forming composition further comprises an organic acid.

11. The pattern formation method according to claim 1, wherein the acidic film-forming composition further comprises an acid selected from alkylcarboxylic acid, alkylsulfonic acid, fluorinated alkylsulfonic acid, and alkylbenzenesulfonic acid.

12. The pattern formation method according to claim 9, further comprising an acid selected from alkylcarboxylic acid, alkylsulfonic acid, fluorinated alkylsulfonic acid, and alkylbenzenesulfonic acid.

13. The pattern formation method according to claim 1, wherein the solvent is water.

14. The pattern formation method according to claim 13, wherein the composition further comprises a solvent selected from methanol, ethanol and propanol.

* * * * *